US009812224B2

(12) United States Patent
Yun

(10) Patent No.: US 9,812,224 B2
(45) Date of Patent: Nov. 7, 2017

(54) DATA STORAGE SYSTEM, DATA STORAGE DEVICE AND RAID CONTROLLER

(71) Applicant: Samsung Electronics Co., Ltd., Suwon-si (KR)

(72) Inventor: Eun-Jin Yun, Seoul (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 106 days.

(21) Appl. No.: 14/800,614

(22) Filed: Jul. 15, 2015

(65) Prior Publication Data

US 2016/0110255 A1 Apr. 21, 2016

(30) Foreign Application Priority Data

Oct. 15, 2014 (KR) .................. 10-2014-0139123

(51) Int. Cl.
*G11C 29/00* (2006.01)
*G11C 29/52* (2006.01)
*G06F 11/10* (2006.01)
*G11C 16/34* (2006.01)
*G11C 29/04* (2006.01)

(52) U.S. Cl.
CPC ........... *G11C 29/52* (2013.01); *G06F 11/108* (2013.01); *G06F 11/1012* (2013.01); *G11C 16/3418* (2013.01); *G11C 2029/0411* (2013.01)

(58) Field of Classification Search
CPC ............. G11C 29/52; G11C 2029/4011; G06F 22/073; G06F 11/108; G06F 11/1068; G06F 11/1012
See application file for complete search history.

(56) References Cited

U.S. PATENT DOCUMENTS

| 5,499,337 A | 3/1996 | Gordon |
| 7,099,994 B2 | 8/2006 | Thayer et al. |
| 8,185,784 B2 | 5/2012 | Mccombs et al. |
| (Continued) | | |

OTHER PUBLICATIONS

"NVM Express" Rev 1.1a, Intel Corporation, Sep. 23, 2013.

*Primary Examiner* — Shelly A Chase
(74) *Attorney, Agent, or Firm* — Muir Patent Law, PLLC

(57) ABSTRACT

Provided are a data storage system, a data storage device and a RAID controller, which can control RAID operation and a RAID operating method of a memory device by transmitting a RAID configuration signal to the memory device. The data storage system includes a memory device that may include m nonvolatile memories, where m is a natural number, and a memory controller that may program data to at least the first to mth pages. The data storage system also includes a RAID controller that may generate a RAID configuration signal, including a RAID operation signal for determining whether to activate or deactivate a RAID operation of the memory device, and that may transmit the data and the RAID configuration signal to the memory controller. The memory controller may generate a RAID parity using first to (m−1)th data from the RAID controller and program the first to (m−1)th data to the first to (m−1)th pages and the RAID parity to the mth page when the RAID operation signal is activated, but program the first to mth data received from the RAID controller to the first to mth pages when the RAID operation signal is deactivated.

20 Claims, 14 Drawing Sheets

(56) References Cited

U.S. PATENT DOCUMENTS

| | | | |
|---|---|---|---|
| 8,230,193 B2 | 7/2012 | Klemm | |
| 8,281,220 B2* | 10/2012 | Kitahara | G06F 11/073 |
| | | | 365/185.09 |
| 8,484,415 B2 | 7/2013 | Cho | |
| 8,495,460 B2 | 7/2013 | Flynn et al. | |
| 8,645,749 B2* | 2/2014 | Reche | G06F 11/108 |
| | | | 714/6.1 |
| 8,719,619 B2 | 5/2014 | Li et al. | |
| 8,775,864 B2 | 7/2014 | Brown et al. | |
| 8,775,868 B2 | 7/2014 | Colgrove et al. | |
| 8,782,292 B2 | 7/2014 | Madhusudana et al. | |
| 2007/0067563 A1* | 3/2007 | Smith | G06F 8/65 |
| | | | 711/114 |
| 2009/0172335 A1* | 7/2009 | Kulkarni | G06F 3/061 |
| | | | 711/170 |
| 2012/0278527 A1 | 11/2012 | Cho et al. | |
| 2013/0042053 A1 | 2/2013 | Huang | |
| 2013/0339784 A1 | 12/2013 | Bickelman et al. | |
| 2014/0215147 A1 | 7/2014 | Pan | |
| 2014/0215262 A1 | 7/2014 | Li et al. | |

\* cited by examiner

1200

1300

1400

DATA STORAGE SYSTEM, DATA STORAGE DEVICE AND RAID CONTROLLER

CROSS-REFERENCE TO RELATED APPLICATION

This application claims priority from Korean Patent Application No. 10-2014-0139123 filed on Oct. 15, 2014 in the Korean Intellectual Property Office, and all the benefits accruing therefrom under 35 U.S.C. 119, the contents of which in its entirety are herein incorporated by reference.

BACKGROUND

1. Field of the Invention

The present inventive concept relates to a data storage system, a data storage device and a RAID controller.

2. Description of the Related Art

A redundant array of independent or inexpensive disks (RAID) is a technology mainly used in a storage medium, such as a server, having important data. When a RAID parity is stored in one of storage media and a data error occurs on another storage media, a RAID recovery is performed using the RAID parity to recover the data. Therefore, RAID can maintain the balance of input and output operations, thereby improving the overall performance of a server.

Currently, solid state drives (SSDs) are ever increasingly replacing hard disk drives (HDDs). A semiconductor memory used in an SSD may include, for example, NAND flash memory chips. Since a page is generally a basic unit of a read or write operation of the NAND flash, a stripe may be constructed on a page-by-page basis and a RAID recovery may be performed on the stripe.

In some SSDs, a plurality of semiconductor chips are mounted on a single substrate using surface mount technology (SMT). However, when one of the plurality of semiconductor chips does not operate, hot swapping may not be performed.

SUMMARY

The present disclosure provides a data storage system, data storage device, and a RAID controller, each of which may control a RAID operation (or non-operation) and a RAID operating method of a memory device by transmitting a RAID configuration signal to the memory device.

The data storage system may include a memory device, including a plurality of nonvolatile memory and a plurality of memory controllers that may program data to the first to mth pages of the plurality of nonvolatile memory, where m is a natural number. The data storage system may also include a RAID controller that generates a RAID configuration signal, including a RAID operation signal for determining whether to activate or deactivate a RAID operation of the memory device, and transmits the data and the RAID configuration signal to the memory controller. The memory controller may generate a RAID parity using first to (m−1)th data from the RAID controller, program the first to (m−1)th data to the first to (m−1)th pages and the RAID parity to the mth page when the RAID operation signal is activated, and program the first to mth data received from the RAID controller to the first to mth pages when the RAID operation signal is deactivated.

The present disclosure also provides a data storage device, including first to mth memory chips, where m is a natural number. The data storage device may also include a plurality of memory controllers that may program data to the first to mth memory chips. The data storage device may also include a controller that may receive a RAID configuration signal, including a RAID operation signal for determining whether to activate or deactivate a RAID operation, and data from a host. The data storage device's controller may also transmit the RAID configuration signal to at least one of the plurality of memory controllers and control RAID operations of the plurality of memory controllers using the RAID configuration signal. Each of the memory controllers may generate a RAID parity using first to (m−1)th data from the controller. Each of the memory controllers may also program the first to (m−1)th data to the first to (m−1)th memory chips and program the RAID parity to the mth memory chip when the RAID operation signal is activated. Each of the memory controllers may also program the first to mth data received from the controller to the first to mth memories when the RAID operation signal is deactivated.

The present disclosure also provides a RAID controller, including a signal receiver. The signal receiver may receive a health status report, including RAID operation data of the memory chips, a position and status of a defective chip, and a RAID rebuild progress status, from a memory device undergoing a RAID operation. The RAID controller may also include a processor, which may determine whether to activate the RAID operation signal using content from the health status report. The RAID controller may also include a signal generator, which may generate a RAID configuration signal, including a RAID operation signal using a determination result value of the processor. The RAID controller may also include an interface to transmit the RAID configuration signal to the memory device, and an error correcting unit.

The present disclosure also provides a data storage device that may include a plurality of memory controllers configured to program data to first to mth memory chips, except for when an error is detected in one of the first to mth memory chips. In such an event at least one of the memory controllers may be configured to generate a RAID parity using a first to (m−2)th data received and then program the first to (m−2)th data to first to (m−2)th memory chips and the RAID parity to the remaining (i.e. without error) memory chip. The memory chip in which the error was detected may not be programmed by the (m−2)th data or the RAID parity.

The data storage device may support a RAID operating method, e.g. RAID level 0, RAID level 1, RAID level 5, RAID level 6, RAID level 10, merged RAID level or other RAID levels. The RAID parity may be a plurality of RAID parities

DETAILED DESCRIPTION OF THE EXEMPLARY EMBODIMENTS

Figure 1:
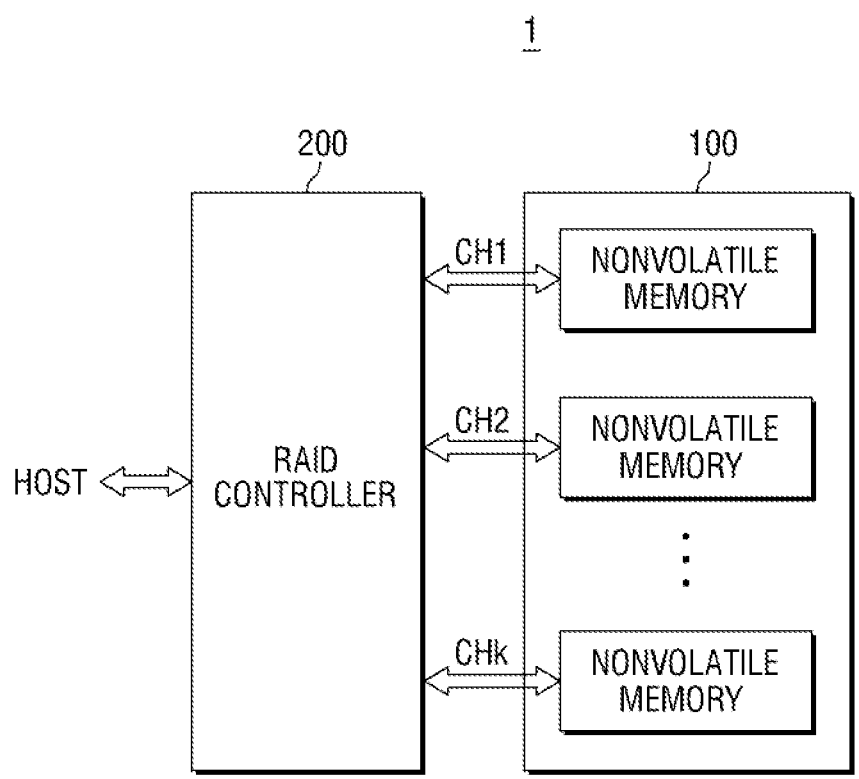
FIG. 1 is a block diagram of a data storage system according to an exemplary embodiment of the present inventive concept.

Advantages and features of the present inventive concept and methods of accomplishing the same may be understood more readily by reference to the following detailed description of exemplary embodiments and the accompanying drawings. The present inventive concept may, however, be embodied in many different forms and should not be construed as being limited to the exemplary embodiments set forth herein. These exemplary embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. Like reference numerals refer to like elements throughout the specification. The language of the claims should be referenced in determining the requirements of the invention.

The terminology used herein is for the purpose of describing particular exemplary embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising," "includes", and/or "including" when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Regions illustrated in the figures of exemplary embodiments are schematic in nature and their shapes may not illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a data storage system, a data storage device and a RAID controller according to exemplary embodiments of the present inventive concept will be described with reference to FIGS. 1 to 14. FIG. 1 is a block diagram of a data storage system according to an exemplary embodiment of the present inventive concept.

Referring to FIG. 1, the data storage system 1 includes a memory device 100 and a RAID controller 200.

The memory device 100 may include, for example, a plurality of nonvolatile memory chips. The plurality of nonvolatile memory chips may communicate with the RAID controller 200 through, for example, 1st to kth channels CH1 to CHk. The plurality of nonvolatile memories illustrated in FIG. 1 (each communicating with a separate corresponding one of channels CH1 to CHk) may be comprised of one or more chips and may be provided in separate packages or may be provided in one or more shared packages.

The RAID controller 200 may access the memory device 100 at a request from the host. For example, the RAID controller 200 may control read, write, erase, and background operations of the memory device 100.

Although not shown, the RAID controller 200 provides interfacing between the memory device 100 and the host. The RAID controller 200 may drive firmware for controlling the memory device 100.

As an example, the RAID controller 200 may further include well-known components, such as a random access memory (RAM), a processing unit, a host interface, a memory interface, and the like. The RAM may be used as at least one of a working memory of the processing unit, a cache memory between the memory device 100 and the host, and a buffer memory between the memory device 100 and the host. The processing unit controls the overall operation of the RAID controller 200.

In the present embodiment, the RAID controller 200 may further include an error correction block (not shown). The error correction block (not shown) may be configured to detect an error of data read from the memory device 100 using an error correction code (ECC) and to correct the error. The error correction block (not shown) may be provided as one component of, for example, the RAID controller 200.

The RAID controller 200 may also perform RAID recovery of the memory device 100. In detail, the RAID controller 200 may perform RAID recovery of the memory device 100 on a sub stripe basis. In more detail, the RAID controller 200 may perform external RAID recovery of the memory device 100 on a sub stripe basis.

The external RAID recovery and error correction code (ECC) technology may be incorporated into the data storage system 1. Internal RAID recovery and ECC technology may be incorporated into the data storage system 1 according to some other exemplary embodiments. The external RAID recovery technology includes storing RAID parity data in one of a plurality of independent semiconductor chips and recovering the stored data, and the internal RAID recovery technology comprises storing RAID parity data in one semiconductor chip and recovering the stored data.

In addition, the RAID architecture used in some embodiments of the present inventive concept may have various levels. For example, the RAID architecture may have any one of RAID level 0 (striped set without parity or striping), RAID level 1 (mirrored set without parity or mirroring), RAID level 2 (hamming code parity), RAID level 3 (striped set with dedicated parity, bit interleaved parity, or byte level parity), RAID level 4 (block level parity), RAID level 5 (striped set with distributed parity or interleave parity), RAID level 6 (striped set with dual distributed parity), RAID level 7, RAID level 10 and RAID level 53, or a RAID level (e.g., RAID 0+1, RAID 1+0, RAID 5+0, RAID 5+1, or RAID 0+1+5) obtained by merging at least two of the above RAID levels. Detailed operations of the RAID controller 200 according to some exemplary embodiments of the present embodiment will later be described.

The host interface may include a protocol to exchange data between the host and the RAID controller 200. For example, the RAID controller 200 may be configured to communicate with an external device (host) through one of various interface protocols such as universal serial bus (USB), multimedia card (MMC), peripheral component interconnect (PCI) protocol, PCI-express (PCI-E) protocol, advanced technology electronics (ATA) protocol, serial-ATA protocol, parallel-ATA protocol, small computer system interface (SCSI) protocol, enhanced small disk interface (ESDI) protocol, and integrated drive electronics (IDE) protocol.

In the present embodiment, the RAID controller 200 and the memory device 100 may be integrated into a single semiconductor device. As an example, the RAID controller 200 and the memory device 100 may be integrated as one semiconductor device to comprise a memory card. For example, the RAID controller 200 and the memory device 100 may be integrated as one semiconductor device to configure a PC card (for example, PCMCIA), a compact flash card (CF), a smart media card (SM/SMC), a memory stick, a multimedia card (for example, MMC, RS-MMC and MMCmicro), an SD card (for example, SD, miniSD and microSD), and a universal flash memory device (for example, UFS).

The RAID controller 200 and the memory device 100 may be integrated into one semiconductor device to constitute a solid state drive (SSD). In a case where the RAID controller 200 and the memory device 100 are integrated into one semiconductor device to be used as the SSD, the operating speed of the host connected to the memory system can be remarkably improved, but aspects of the present inventive concept are not limited thereto. The RAID controller 200 and the memory device 100 may be configured to be physically detachable.

In alternative exemplary embodiments of the present inventive concept, the data storage system 1 may be incorporated into a computer, an ultra mobile personal computer (UMPC), a work station, a net-book, a personal digital assistant (PDA), a portable computer, a web tablet, a wireless phone, a mobile phone, a smart phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, a digital video player, or a device capable of transmitting/receiving information in wireless environments, one of various electronic devices constituting a home network, one of various electronic devices constituting a computer network, one of various electronic devices constituting a telematics network, RFID devices, or embedded computing systems.

As an example, the memory device 100 or the data storage system 1 may be mounted in various types of packages. Examples of the packages of the memory device 100 or the data storage system 1 may include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Substrate (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), Thin Quad Flatpack (TQFP), System In Package (SIP), Multi Chip Package (MCP), Wafer-level Fabricated Package (WFP), and Wafer-Level Processed Stack Package (WSP).

Figure 2:
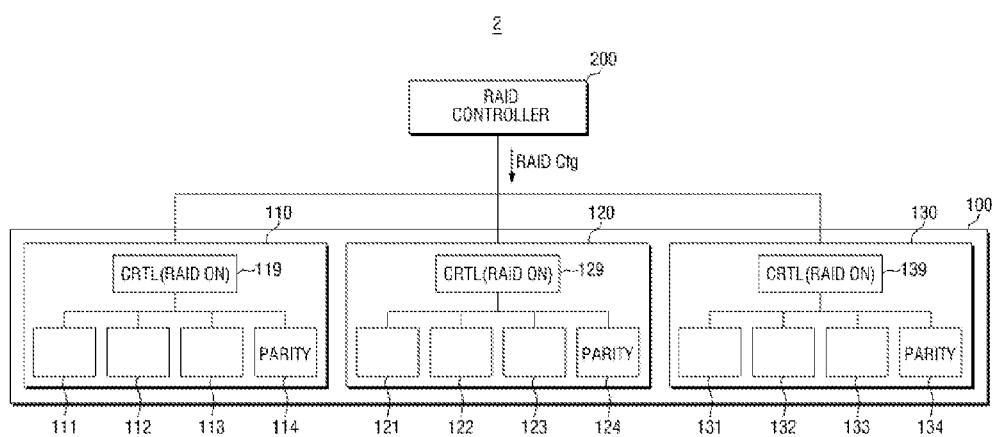
FIG. 2 is a block diagram of a data storage system according to another exemplary embodiment of the present inventive concept.
Figure 3:
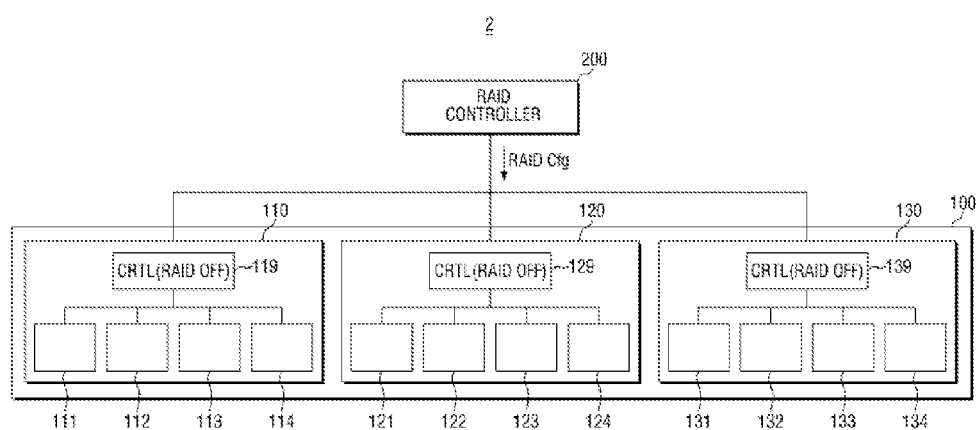
FIGS. 3 and 4 illustrate operations of a data storage system according to another exemplary embodiment of the present inventive concept.
Figure 4:
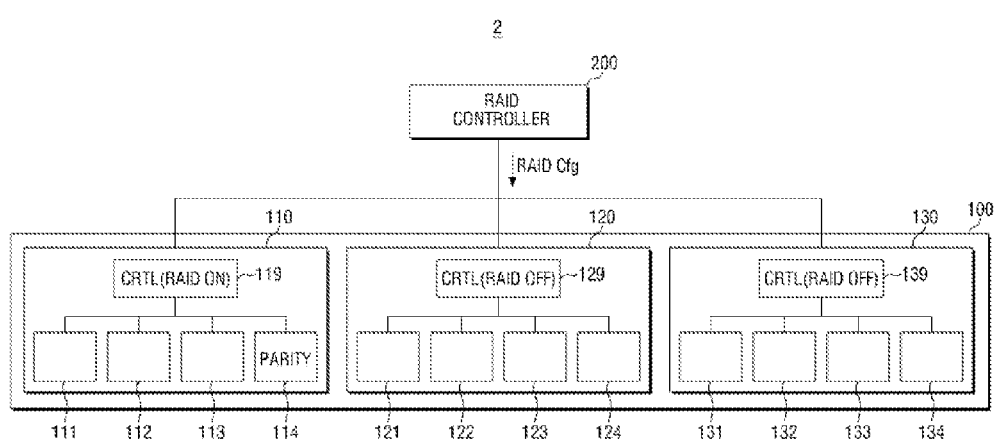

FIG. 2 is a block diagram of a data storage system according to an embodiment of the present inventive concept and FIGS. 3 and 4 illustrate operations of a data storage system according to another embodiment of the present inventive concept.

Referring to FIG. 2, the data storage system 2 according to another embodiment of the present inventive concept includes a memory device 100 and a RAID controller 200. The data storage system 2 may be configured and incorporated in substantially the same manner as the data storage system 1 shown in FIG. 1.

The memory devices 110, 120 and 130 may include a plurality of nonvolatile memories 111 to 114, 121 to 124, and 131 to 134 and a plurality of memory controllers 119, 129 and 139. Hereinafter, the nonvolatile memories 111 to 114 and the memory controller 119 will be described by way of example, however, the details of the same will be recognized as applicable to the corresponding elements of memory devices 120 and 130.

The nonvolatile memories 111 to 114 may each include at least m pages, where m is a natural number. In the nonvolatile memories 111 to 114, a page is a basic unit of read and program (or write) operations. For example, a page may correspond to data accessed (such as read out to a NAND flash memory page buffer) when a row identified by a row address is activated. The nonvolatile memories 111 to 114 may each be composed of one or more nonvolatile memory chips. For example, the memory device 100 may include four nonvolatile memories 111 to 114, which may be four nonvolatile memory chips.

The nonvolatile memories 111 to 114 may include magnetic tapes, floppy disks, hard disks, optical disks, electrical erasable programmable ROMs (EEPROMs), flash memories, and so on, but aspects of the present inventive concept are not limited thereto.

In addition, the nonvolatile memories 111 to 114 may include m memory blocks that are selected in an access operation. Typically, each of the memories may include a plurality of memory blocks, with each block comprising a plurality of pages. When the nonvolatile memories 111 to 114 are composed of NAND flash memory chips, a memory block may be the minimal erase unit, such that all pages in a block are erased together in a single erase operation. However, as noted, the invention may be implemented using memories other than NAND flash memory chips. The first to mth pages may be arranged respectively in the first to mth memory blocks (each page in a different block). The first to mth memory blocks may be sequentially or randomly arranged in one of or the plurality of nonvolatile memories 111 to 114, but aspects of the present inventive concept are not limited thereto. The nonvolatile memories 111 to 114 may include a plurality of memory chips and the first to mth pages may each be arranged in different memory chips.

The memory controller 119 may control the plurality of nonvolatile memories 111 to 114. The memory controller 119 may program data to at least the first to mth pages included in the nonvolatile memories 111 to 114. That is to say, the memory controller 119 may perform read, write (which also may be referred to as "programming") and erase operations on the nonvolatile memories 111 to 114.

The memory controller 119 may receive the data from the RAID controller 200. The data may be transmitted to the nonvolatile memories 111 to 114 to perform a write command. The data may include an error correction code (ECC). The ECC is a code for identifying whether there is a loss, a correction or an error in data. The ECC may be calculated for and associated with (e.g., stored together with) a predetermined data unit (e.g., data of a predetermined size). The data may also include one or more parity bits and non-parity bits (e.g., a byte of normal or user data and a parity bit(s) associated with the byte of normal or user data, or a byte of normal or user data with the calculated corresponding ECC and an associated parity bit(s)).

RAID operations may rely on parity checking for detecting errors. Implementing ECC in an error correction circuit (e.g. as part of a RAID controller, memory controller, or host) may enable recovery of data. RAID operation may therefore be used in some example embodiments until another data recovery system is preferred. In examples where RAID is no longer desired, the data storage system can be switched into a configuration where ECC is used for error correction. Memory regions previously used in RAID operations to store parity (e.g. parity stored in the mth page) may then become available for other uses, such as storage of data and/or ECC. In example embodiments of the present disclosure, ECC code may be stored in all of the 1st to mth pages along with associated data. For example, each of the 1st to mth pages may store user data and associated ECC code for the data of that page. By doing so, ECC correction may be performed on a page by page basis (e.g. as in certain ECC NAND implementations).

The memory controller 119 may generate a RAID parity using first to (m−1)th data. The RAID parity may be used in determining whether an error is generated in data during a RAID operation in which a plurality of disks are connected in parallel and used. The RAID parity may include a single RAID parity or a plurality of RAID parities according to the RAID operating method. In addition, one RAID parity may be copied multiple times, consistent with the known technology in the art.

For example, when the memory controller 119 controls the four nonvolatile memories 111 to 114, the memory controller 119 may generate the RAID parity using first to third data. The first to third data may be programmed to first to third pages and the generated RAID parity may be programmed in a fourth page included in one of the plurality of nonvolatile memories 111 to 114, but aspects of the present inventive concept are not limited thereto. The memory controller 119 may drive a RAID operation using more nonvolatile memories.

The RAID controller 200 may control the memory controller 119. The data storage system 2 may include a plurality of memory devices 110, 120 and 130. Accordingly, the RAID controller 200 may control the plurality of memory controllers 119, 129 and 139. The RAID controller 200 may generate a RAID configuration signal including a RAID operation signal for determining whether to activate RAID operations at the memory devices 110, 120 and 130, and the RAID controller 200 may transmit the data and the RAID configuration signal to the memory controllers 119, 129 and 139.

The RAID configuration signal may include a RAID operation signal for turning the RAID operations ON and OFF. For example, the memory controller 119 may generate the RAID parity using the first to (m−1)th data received from the RAID controller when the RAID operation signal included in the RAID configuration signal is activated (i.e. turned ON). The memory controller 119 may then program the first to (m−1)th data to the first to (m−1)th pages and the RAID parity to the mth page. That is to say, the RAID operations of the memory device 110 may be activated. The RAID operations of the memory devices 110, 120 and 130 may be performed in various RAID levels. For example, the RAID operating method of the memory device 100 may include RAID level 0, RAID level 1, RAID level 5, RAID level 6, RAID level 10, and merged RAID level, but aspects of the present inventive concept are not limited thereto.

However, when the RAID operation signal included in the RAID configuration signal is deactivated (i.e. turned OFF), the first to mth data received from the RAID controller may be programmed to the first to mth pages. That is to say, only the data received by the RAID controller 200 may be stored in the nonvolatile memories 111 to 114 of the memory device 110 without using the RAID parity.

This process may also be applied in a case where RAID operation is supported from outside of the memory device 100 (e.g., SSD). In this case, if the RAID operation in the memory device 100 is turned OFF, a resulting spare area may be used for ECC (e.g., ECC may be generated and stored in the resulting spare area), utilization efficiency of the spare area of the memory device 100 can be increased. Accordingly, consumption of the spare area (e.g., when using RAID) may be used for ECC when RAID is not used and the performance and reliability of the memory device 100 can be improved.

Referring to FIG. 3, the RAID controller 200 may transmit the generated RAID configuration signal by deactivating the RAID operation signal to prevent the plurality of memory controllers 119 included in the memory device 100 from performing the RAID operation. In this case, RAID functions of all of the memory controllers 119, 129 and 139 included in the memory device 100 are controlled OFF such that the memory controllers 119, 129, and 139 may be used for storing data in the spare area in which the RAID parity is stored, thereby suppressing the spare area from being consumed due to the use of RAID in an area not requiring RAID operation. In addition, the memory controllers 119, 129 and 139 may be set to run under different RAID operating methods. For example, the RAID operating method may include RAID level 0, RAID level 1, RAID level 5, RAID level 6, RAID level 10, and merged RAID level, but aspects of the present inventive concept are not limited thereto.

Referring to FIG. 4, the RAID controller 200 may transmit the generated RAID configuration signal by deactivating the RAID operation signal to prevent only some of the plurality of memory controllers 119, 129 and 139 included in the memory device 100 from performing the RAID operation. In this case, only the RAID functions of the memory controllers 119, 129 and 139 controlling nonvolatile memories determined as not requiring RAID operations (e.g. determined from among nonvolatile memories 111 to 114, 121 to 124, and 131 to 134 included in the memory device 100) are controlled OFF. The RAID controller 200 may analyze the health status report received from the memory controllers 119, 129 and 139 and may determine that no RAID operation is required or otherwise desired. The nonvolatile memories 111 to 114 and the memory controller 119 will now be described by way of example.

The health status report may include RAID operation data of the nonvolatile memories 111 to 114, a position and status of a defective chip, and a RAID rebuild progress status. When there is a RAID rebuild request in the RAID configuration signal of the RAID controller 200, the RAID rebuild may be performed. For example, when there is a RAID rebuild request, the memory controller 119 may copy data included in the nonvolatile memories 111 to 114 in which there is the RAID rebuild request (e.g., to a different drive or virtual drive, e.g., in other ones of nonvolatile memories 121 to 124 and 131 to 134) or a usable space can be rebuilt in the nonvolatile memories 111 to 114. Next, the memory controller 119 may store the data or the RAID parity again in the RAID rebuilt nonvolatile memories 111 to 114, but aspects of the present inventive concept are not limited thereto.

The memory controller 119 may generate the health status report to then transmit the same to the RAID controller. The RAID controller may activate the RAID operation signal depending on content of the health status report and may deactivate some or all of the RAID operations of the memory controller 119. Accordingly, consumption of the spare area due to use of RAID in an area not actually requiring the RAID can be reduced and the performance and reliability of the memory device 100 can be improved. For example, the areas of memory made available by not using RAID may be used for ECC code storage (e.g., of ECC code corresponding to data stored elsewhere in the chip or other chips).

Referring again to FIG. 2, the RAID configuration signal may further include a RAID recovery time, a RAID operating method, RAID configuration areas in the nonvolatile memories 111 to 114, and a RAID partial operation signal. In detail, the RAID controller 200 may perform RAID operations on only some portions of the plurality of nonvolatile memories 111 to 114 controlled by the memory controller 119. In addition, the RAID controller 200 may also control the RAID operating method, the RAID recovery time, the number of RAID engines, a chip out command after the RAID is controlled OFF, and so on. In addition, the RAID controller 200 may also control the RAID operation to be performed on only the remaining, non-defective memory chips, which will later be described in detail.

The RAID operation of the memory controller 119 may be performed by first performing a parity check, and when an error is detected performing RAID recovery operations of the nonvolatile memories 111 to 114, but aspects of the present inventive concept are not limited thereto. For example, the memory controller 119 may first perform RAID recovery operations of the nonvolatile memories 111 to 114, and may additionally perform an ECC check when an error is generated during the RAID recovery operations.

The memory device 100 may comprise a solid state drive (SSD), but aspects of the present inventive concept are not limited thereto.

In addition, the RAID controller 200 may be positioned outside the memory device 100. The RAID controller 200 and the memory device 100 may be detachably mounted. That is to say, the data storage system 2 according to an embodiment of the present inventive concept may include a plurality of memory devices 100, and some of the plurality of memory devices 100 may be detachably mounted on the RAID controller 200. Accordingly, some of the plurality of memory devices 100 connected to the RAID controller 200 may be replaceable, but aspects of the present inventive concept are not limited thereto.

Figure 5:
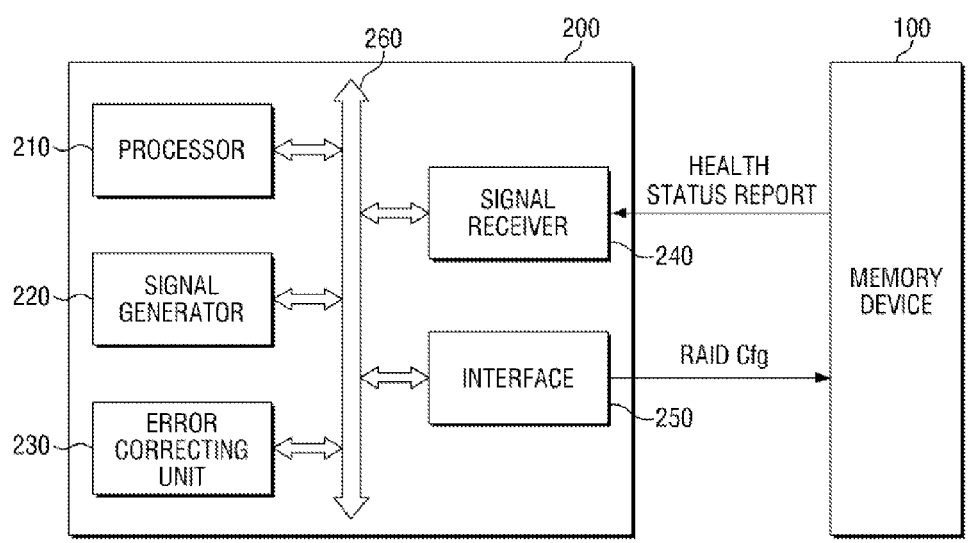
FIG. 5 is a block diagram of a data storage system for explaining a RAID controller according to an exemplary embodiment of the present inventive concept.

FIG. 5 is a block diagram of a data storage system for explaining a RAID controller according to an embodiment of the present inventive concept. For the sake of convenient explanation, repeated descriptions of the same content as described above in the previous embodiment will be omitted and the following description will focus on differences between the present and previous exemplary embodiments.

Referring to FIG. 5, in the data storage system 3 according to an embodiment of the present inventive concept, the RAID controller 200 includes a signal receiver 240, a processor 210, a signal generator 220, an interface 250, an error correcting unit 230, and a bus 260.

The signal receiver 240 may receive a health status report, including RAID operation data, a position and status of a defective chip (e.g. a status of the chip may represent that the chip includes defective data or data with at least one bit error), and a RAID rebuild progress status from the memory device 100 enabling RAID operations. The health status report may be prepared by the memory controller 119 of the memory device 100 and may indicate states of the nonvolatile memories 111 to 114 controlled by the memory controller 119.

The processor 210 may activate the RAID operation signal depending on content of the health status report. When there is a defective chip in the memory device 100, the processor 210 may determine the RAID operating method of the memory device 100 in consideration of the position and status of the defective chip included in the health status report. For example, the processor 210 may determine ON/OFF control of the RAID operation, a partial RAID operation, a RAID rebuild operation, a RAID operating method, and so on, but aspects of the present inventive concept are not limited thereto.

The signal generator 220 may generate a RAID configuration signal including a RAID operation signal using a determination result value of the processor 210. The RAID configuration signal may further include a RAID recovery time, a RAID operating method, a RAID configuration area in the nonvolatile memory 110, a RAID partial operation signal, and so on. The RAID operating method may include RAID level 0, RAID level 1, RAID level 5, RAID level 6, RAID level 10, and merged RAID level, but aspects of the present inventive concept are not limited thereto.

The interface 250 may transmit the RAID configuration signal to the memory device 100. In addition, the interface 250 may transmit data received from the host to the memory device 100 (not shown). The data may include an ECC.

The error correcting unit 230 may detect an error in the data read from the memory device 100 using the ECC and may correct the error, but aspects of the present inventive concept are not limited thereto. The memory controller 119 of the memory device 100 may also detect an error in the data read from the memory device 100 using the ECC.

The bus 260 may be used to allow the signal receiver 240, the processor 210, the signal generator 220, the interface 250 and the error correcting unit 230 to communicate with each other. In some exemplary embodiments of the present inventive concept, the bus 260 may have a multi-layered structure.

Figure 6:
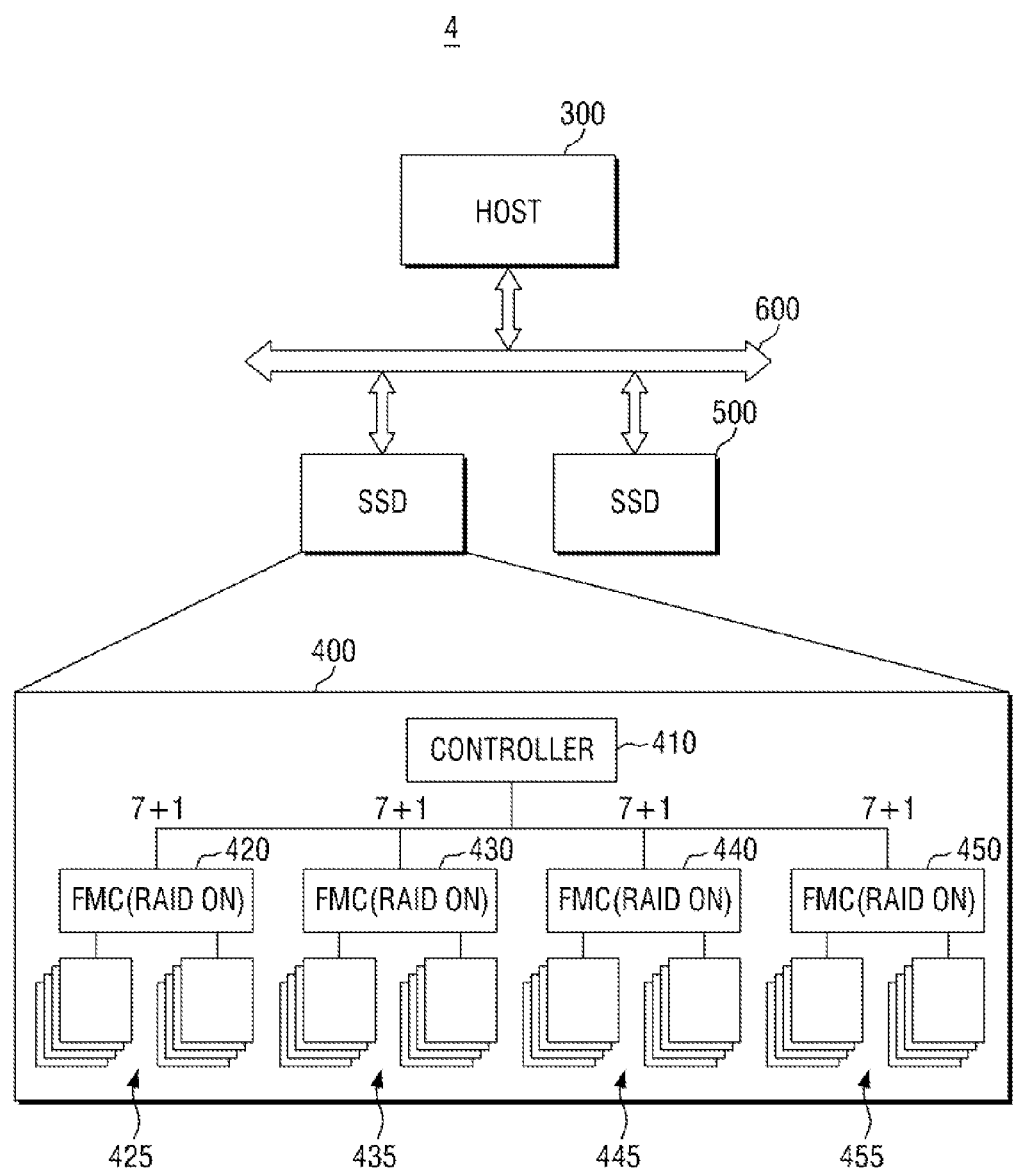
FIG. 6 is a block diagram of a data storage system according to still another exemplary embodiment of the present inventive concept.
Figure 7:
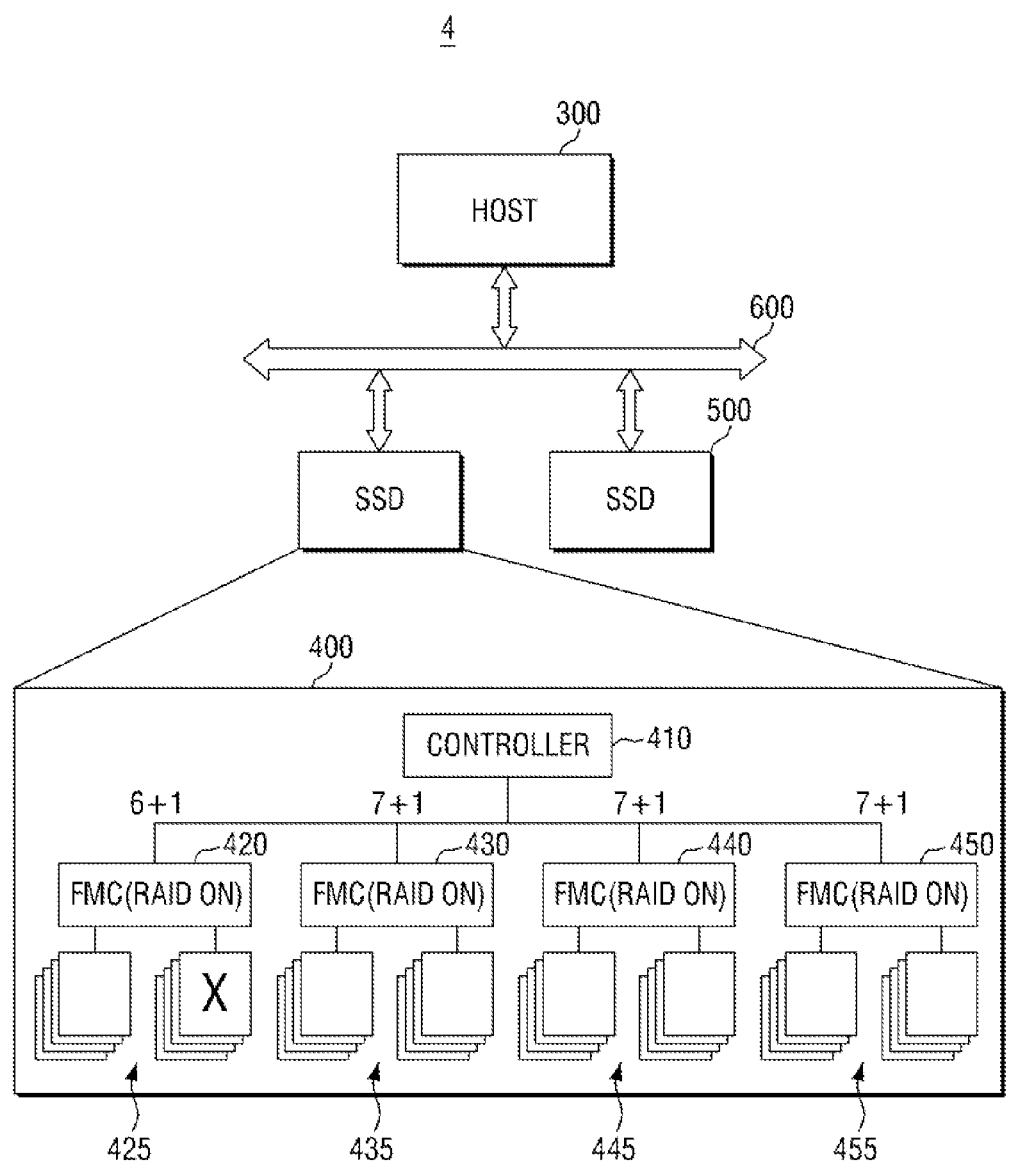
FIG. 7 illustrates operations of a data storage system according to still another exemplary embodiment of the present inventive concept.

FIG. 6 is a block diagram of a data storage system according to still another embodiment of the present inventive concept and FIG. 7 illustrates operations of a data storage system according to still another embodiment of the present inventive concept. For the sake of convenient explanation, repeated descriptions of the same content as described above in the previous embodiment will be omitted and the following description will focus on differences between the present and previous exemplary embodiments.

Referring to FIG. 6, the data storage system 4 according to still another embodiment of the present inventive concept includes a host 300, a data storage device 400, and a bus 600.

In the data storage system 4 according to still another embodiment of the present inventive concept, the configuration and operation of the host 300 may be substantially the same as those of the RAID controller 200 shown in FIG. 5.

The data storage device 400 may include a plurality of memory chips 425, 435, 445 and 455, memory controllers (e.g., flash memory controllers (FMCs)) 420, 430, 440 and 450, and a controller 410. The memory chips 425 and the memory controller 420 will now be described by way of example.

The memory controller 420 may program data to the plurality of memory chips 425. For example, one memory controller 420 may control m memory chips 425.

The controller 410 may control the plurality of memory controllers 420, 430, 440 and 450. The controller 410 may receive data and a RAID configuration signal including a RAID operation signal for determining whether to activate a RAID operation from the host 300 and may transmit the same to the plurality of memory controllers 420, 430, 440 and 450.

The RAID configuration signal may include a RAID operation signal for controlling ON/OFF the RAID operation. For example, the controller 410 may control RAID operation of the memory controller 420 using the RAID configuration signal, and the memory controller 420 may generate a RAID parity using first to (m−1)th data received from the controller 410 and may program the first to (m−1)th data to the first to (m−1)th memory chips 425 and the RAID parity to the mth memory chip 425 when the RAID operation signal is activated.

When the RAID operation signal is deactivated, each of the memory controllers 420, 430, 440 and 450 may program the first to mth data to the first to mth memory chips 425. If the RAID operation in the memory device 400 is controlled OFF and a spare area is reinforced by ECC, utilization efficiency of the spare area of the memory device 400 can be increased. Accordingly, consumption of the spare area due to the use of RAID in an area not requiring RAID can be reduced and the performance and reliability of the memory device 400 can be improved.

The RAID configuration signal may include a RAID recovery time, a RAID operating method, a RAID configuration area in the nonvolatile memory, and a RAID partial operation signal. In detail, the RAID controller 410 may control RAID operations to be performed on only some regions of the plurality of nonvolatile memories 425 controlled by the memory controller 420. In addition, the RAID controller 410 may also control the RAID operating method, the RAID recovery time, the number of RAID engines, a chip out command after the RAID is controlled OFF, and so on. In addition, the RAID controller 410 may also control the RAID operation to be performed on only the non-defective memory chips.

The memory controller 420 may generate the health status report, including RAID operation data of the memory chip 425, a position and status of a defective chip, and a RAID rebuild progress status, to then transmit the same to the host 300.

Referring to FIG. 7, when an error is detected in one of the first to mth memory chips 425, the memory controller 420 may generate a RAID parity using the first to (m−2)th data received from the controller 410 and may program the first to (m−2)th data and the RAID parity to the remaining memory chips 425, except for the memory chip having the error detected therein.

For example, the memory controller 420 may control 8 memory chips 425. When RAID operations are performed on 8 memory chips 425, a RAID parity is generated using 7 pieces of data and is distributed and stored in the 8 memory chips 425. When an error is detected in one among the 8 memory chips 425 controlled by the memory controller 420, the memory controller 420 may perform RAID operations using the remaining 7 memory chips 425, i.e. except for the memory chip having the error detected therein. A subsequent RAID parity is generated using 6 pieces of data and is distributed and stored in the 7 memory chips 425, but aspects of the present inventive concept are not limited thereto. The memory controller 420 may adjust the structure of data and the number of RAID parities used for the RAID operations according to status (i.e. considering the number of the memory chips having the error detected therein to adjust the structure of data and the number of RAID parities). Therefore, even when errors are generated in some of the memory chips 425, the remaining memory chips 425 can be maximally utilized without hot swapping, thereby improving the performance and reliability of the memory device 400. Accordingly, consumption of the spare area due to use of RAID in an area not requiring the RAID can be reduced and reliability of the memory device 400 can be improved while maximizing utilization of a storage area of the memory chips 425.

In addition, when an error is detected in one of the plurality of memory chips 425, the memory controller 420 may perform a RAID rebuild operation. For example, the memory controller 420 may copy data from a different memory location (e.g., a mirrored location, which may in some examples include an ECC) including a copy of the data corresponding to the data having the detected error and may rebuild a usable space in the nonvolatile memory 425. The memory controller 420 may then store data or RAID parity again in the RAID rebuilt nonvolatile memory 425. Accordingly, consumption of a spare area of the semiconductor chip can be reduced, utilization of a storage space of the memory chip 425 can be maximized and system stability can be increased, but aspects of the present inventive concept are not limited thereto.

The bus 600 may allow the host 300 and the data storage device 400 to perform data communication with each other. In some exemplary embodiments of the present inventive concept, the bus 600 may have a multi-layered structure. In addition, the bus 600 may include a protocol for performing data exchange between the host 300 and the controller 410. As an example, the controller 410 may be configured to communicate with the host 300 through one of various interface protocols such as universal serial bus (USB), multimedia card (MMC), peripheral component interconnect (PCI) protocol, PCI-express (PCI-E) protocol, advanced technology electronics (ATA) protocol, serial-ATA protocol, parallel-ATA protocol, small computer system interface (SCSI) protocol, enhanced small disk interface (ESDI) protocol, and integrated drive electronics (IDE) protocol, but aspects of the present inventive concept are not limited thereto.

Figure 8:
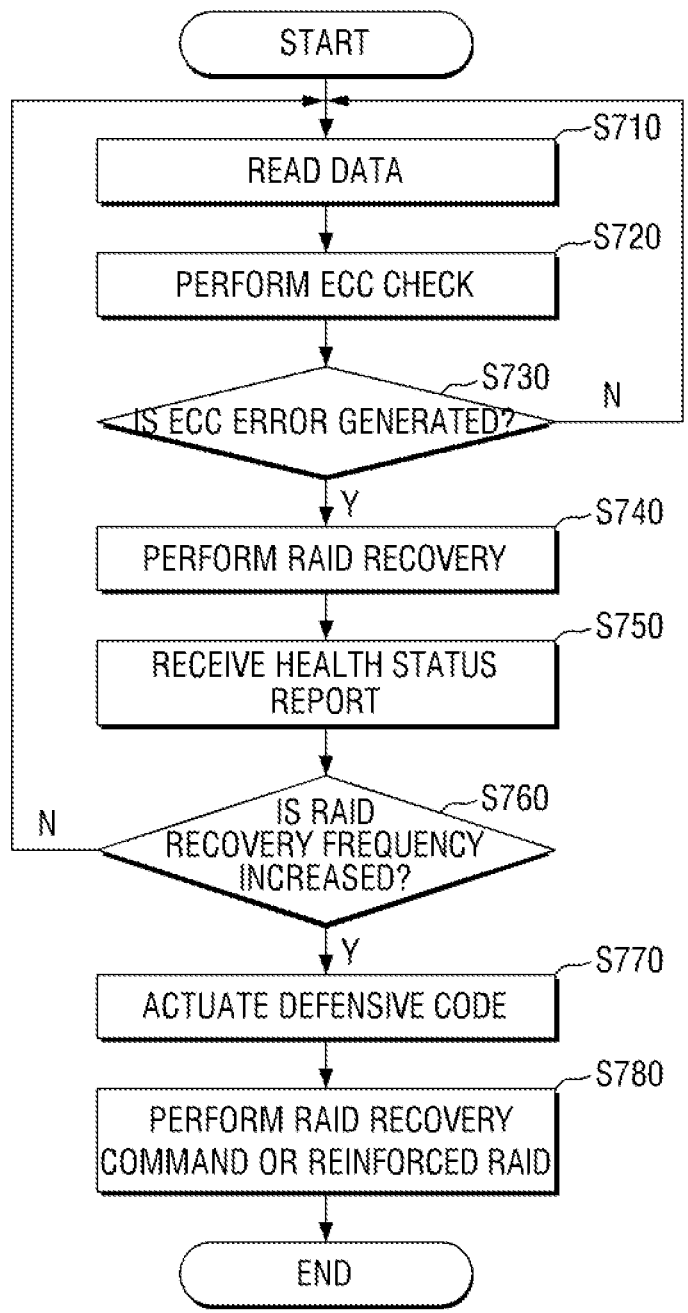
FIG. 8 is a flowchart illustrating operations of a data storage system according to exemplary embodiments of the present inventive concept.

FIG. 8 is a flowchart illustrating operations of a data storage system according to some exemplary embodiments of the present inventive concept. For the sake of convenient explanation, repeated descriptions of the same content as described above in the previous embodiment will be omitted and the following description will focus on differences between the present and previous exemplary embodiments.

Referring to FIG. 8, in the data storage systems 1 to 4 according to some exemplary embodiments of the present inventive concept, a memory controller of a memory device reads data from a nonvolatile memory (S710).

Next, the memory controller performs an ECC check operation using an ECC included with the read data (S720). The ECC check operation may include using the ECC to detect and locate bit errors in the read data and fixing these bit errors when possible (e.g., when the number of bit errors in the read data is below or equal to a certain number n, an ECC circuit may correct the read data using the error correction code (ECC)).

Next, it is determined whether there is an error during the ECC check operation on the read data (S730). The error may be detected during the ECC check operation and comprise the read data including too many bit errors (e.g., a number higher than an integer n) to be corrected by ECC circuit.

Next, when there is an error detected during the ECC check operation of the read data (e.g., bit errors in the read data that the ECC circuit is unable to correct), RAID recovery is performed on the nonvolatile memory chip having the error (S740). The RAID recovery operating method may be enabled when a RAID function is activated. The RAID recovery operating method may include RAID level 0, RAID level 1, RAID level 5, RAID level 6, RAID level 10, and merged RAID level, but aspects of the present inventive concept are not limited thereto.

Next, the memory controller prepares a health status report to report on the result of the RAID recovery. The health status report may include a RAID recovery history, RAID operation data of the nonvolatile memory, a position and status of a defective chip, a RAID rebuild progress status, and so on.

Next, the RAID controller receives the health status report prepared by the memory controller (S750). The RAID controller may determine using the health status report whether to activate the RAID operation signal. In addition, when a defective chip exists in the memory device, the RAID controller may determine a RAID operating method of the memory device in consideration of the position and status of the defective chip included in the health status report, but aspects of the present inventive concept are not limited thereto.

Next, the RAID controller determines using the health status report whether the RAID recovery frequency of the semiconductor device has increased or not (S760). If after S760 the RAID recovery frequency (e.g., with respect to a number of read operations or with respect to time) is determined to have increased (e.g., larger than a certain threshold), the RAID operation may then be turned off.

If the RAID recovery frequency of the semiconductor device has increased (e.g. increased above a predetermined threshold), the RAID controller may actuate a defensive code (e.g. signal processing) (S770). The defensive code may include at least one algorithm for detecting and correcting errors of data received by the RAID controller. The defensive code may be executed in levels of the memory controller as well as the RAID controller. The defensive code may be, e.g., an error correction code (ECC) that is calculated for the stored data and stored with the data (which may be in a similar location, such as an appendix to a page, or a different location, such as on a different page or different chip).

Next, the RAID controller may perform a RAID recovery command or a reinforced RAID operation on the semiconductor device (S780). A RAID recovery command may cause copying of a mirrored copy of the data from a different location to the location where the error was detected. The RAID controller may generate a RAID configuration signal including a RAID operation signal and may control the operation of the semiconductor device (e.g. control data reads from and data writes to the nonvolatile memory).

In FIG. 8, the actuating of the defensive code (S770) and the performing of the reinforced RAID operation (S780) are sequentially performed, but aspects of the present inventive concept are not limited thereto. The sequence of performing steps S770 and S780 may be changed or may be simultaneously performed.

If no error is detected in the ECC check operation of the read data or if the RAID recovery frequency of the semiconductor device is increased, the RAID memory controller may read again another data of the nonvolatile memory (S710).

Next, a computing system according to an embodiment of the present inventive concept will be described with reference to FIG. 9.

Figure 9:
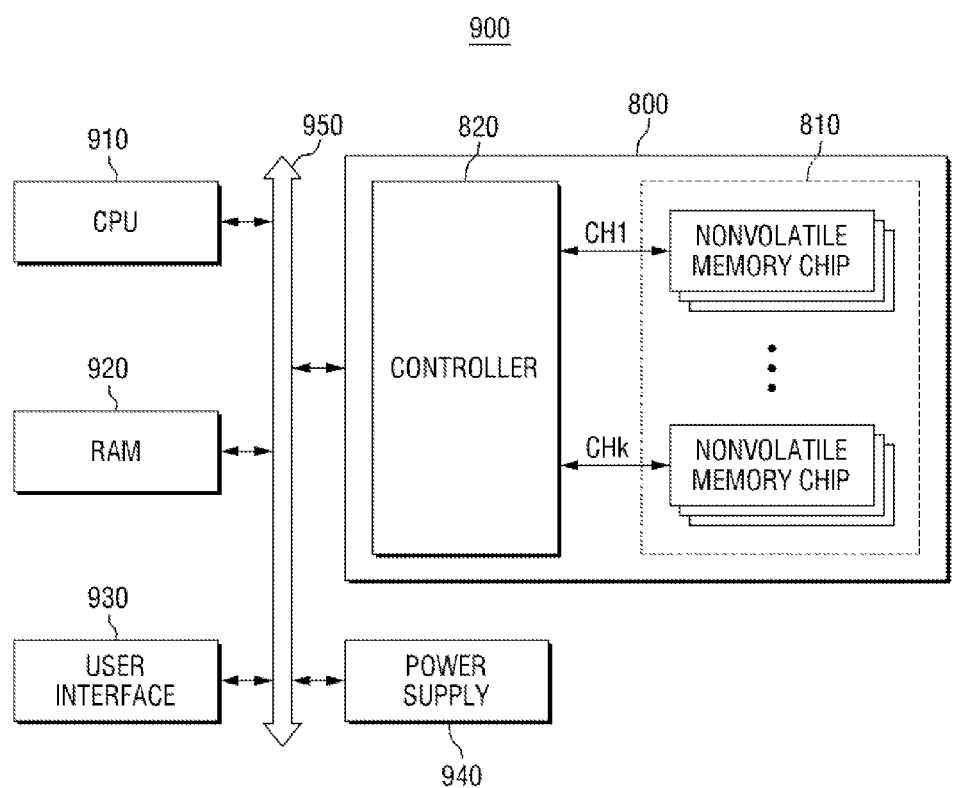
FIG. 9 is a block diagram of a computing system according to an exemplary embodiment of the present inventive concept.

FIG. 9 is a block diagram of a computing system according to an embodiment of the present inventive concept.

Referring to FIG. 9, the computing system 900 may include a central processing unit (CPU) 910, a random access memory (RAM) 920, a user interface 930, a power supply 940, and a memory system 800. Here, the memory system 810 may be a storage system controlling a nonvolatile memory 810 by a controller 820 according to the above-described exemplary embodiments of the present inventive concept. The memory system 800 may be electrically connected to the CPU 910, the RAM 920, the user interface 930 and the power supply 940 through a system bus 950. The data provided through the user interface 930 or processed by the CPU 910 may be stored in the memory system 800.

In FIG. 9, the nonvolatile memory 810 connected to the system bus 950 through the controller 820 is illustrated, but aspects of the present inventive concept are not limited thereto. In computing systems according to some exemplary embodiments of the present inventive concept, the nonvolatile memory 810 may be configured to be directly connected to the system bus 950.

The memory system 800 of FIG. 9 may be the data storage systems 1 and 2, and the computing system 900 of FIG. 9 may be the data storage systems 3 and 4 according to exemplary embodiments of the present inventive concept.

Figure 10:
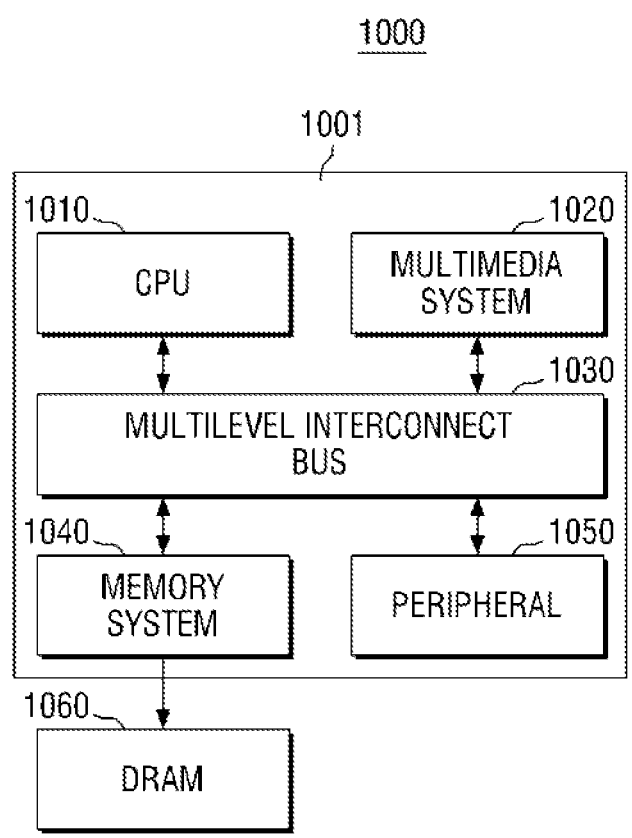
FIG. 10 is a block diagram of an SoC system including semiconductor (e.g. memory) devices and controllers according to exemplary embodiments of the present inventive concept.

FIG. 10 is a block diagram of an SoC system 1000 according to exemplary embodiments of the present inventive concept.

Referring to FIG. 10, the SoC system 1000 may include an application processor (AP) 1001 and a DRAM 1060.

The AP 1001 may include a central processing unit (CPU) 1010, a multimedia system 1020, a bus 1030, a memory system 1040, and a peripheral circuit 1050.

The CPU 1010 of FIG. 10 may perform operations necessary for operating the SoC system 1000. In some exemplary embodiments of the present inventive concept, the CPU 1010 may be configured in a multi-core environment including a plurality of cores.

The multimedia system 1020 may be used in performing a variety of multimedia functions in the SoC system 1000. The multimedia system 1020 may include, e.g. a 3D engine module, a video codec, a display system, a camera system, and a post processor.

The bus 1030 may be used in performing data communication among the central processing unit 1010, the multimedia system 1020, the memory system 1040, and the peripheral circuit 1050. In some exemplary embodiments of the present inventive concept, the bus 1030 may have a multi-layered structure. In detail, examples of the bus 1030 may include a multi-layer advanced high-performance bus (AHB), or a multi-layer advanced eXtensible interface (AXI), but aspects of the present inventive concept are not limited thereto.

The memory system 1040 may provide environments necessary for high-speed operation by connecting the AP 1001 to an external memory (for example, the DRAM 1060). In some exemplary embodiments of the present inventive concept, the memory system 1040 may include a separate controller (for example, a DRAM controller) for controlling the external memory (for example, the DRAM 1060). The memory system 1040 may be implemented by any of the memory system embodiments described herein.

The peripheral circuit 1050 may provide environments necessary for smoothly connecting the SoC system 1000 to an external device (for example, a main board, a human machine interface (HMI), etc.). Accordingly, the peripheral circuit 1050 may include various kinds of interfaces enabling the external device connected to the SoC system 1000 to be compatibly used.

The DRAM 1060 may function as a working memory required to operate the AP 1001. In some exemplary embodiments of the present inventive concept, as shown, the DRAM 1060 may be disposed outside the AP 1001. In detail, the DRAM 1060 may be packaged with the AP 1001 in the form of a package on package (PoP).

At least one of the components of the SoC system 1000 may employ one of the aforementioned data storage systems 1 to 4 according to exemplary embodiments of the present inventive concept. For example, the memory system 1040 may be the data storage systems 1 and 2, and the SoC system 1000 itself may be the data storage systems 3 and 4.

Figure 11:
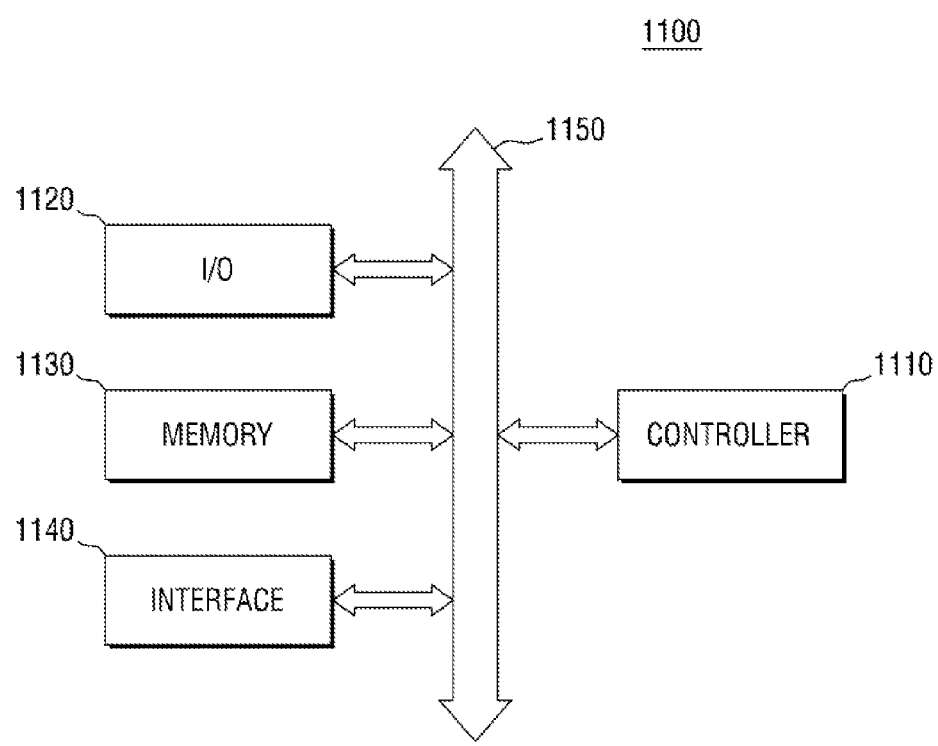
FIG. 11 is a block diagram of an electronic system including semiconductor (e.g. memory) devices and controllers according to exemplary embodiments of the present inventive concept.

FIG. 11 is a block diagram of an electronic system including semiconductor devices and/or memory system components according to exemplary embodiments of the present inventive concept.

Referring to FIG. 11, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a key pad, a key board, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on.

Although not shown, the electronic system 1100 may further include high-speed DRAM and/or SRAM as the working memory for improving the operation of the controller 1110. Here, the data storage systems 1 and 2 according to embodiments of the present inventive concept may be employed as the memory device 1130 and the controller 1110. In addition, the data storage systems 3 and 4 according to embodiments of the present inventive concept may be provided in the electronic system 1100.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 12:
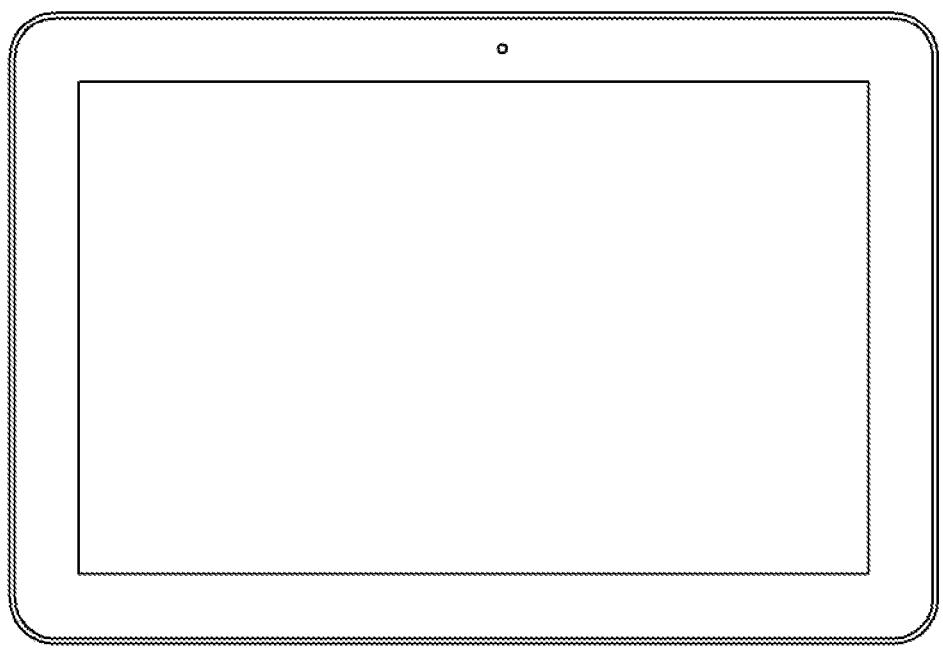
FIGS. 12 to 14 illustrate an exemplary semiconductor system to which semiconductor (e.g. memory) devices and controllers according to some exemplary embodiments of the present inventive concept can be employed.
Figure 13:
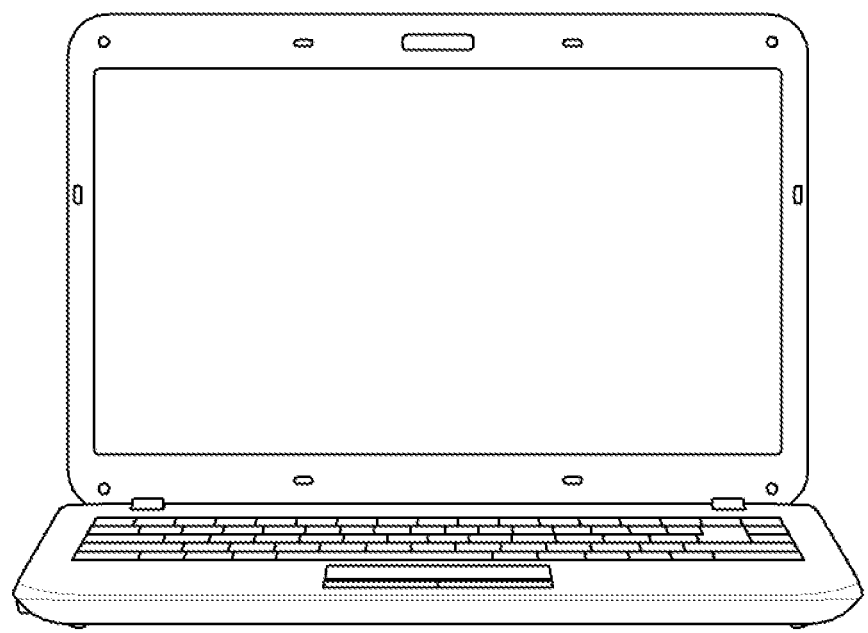
Figure 14:
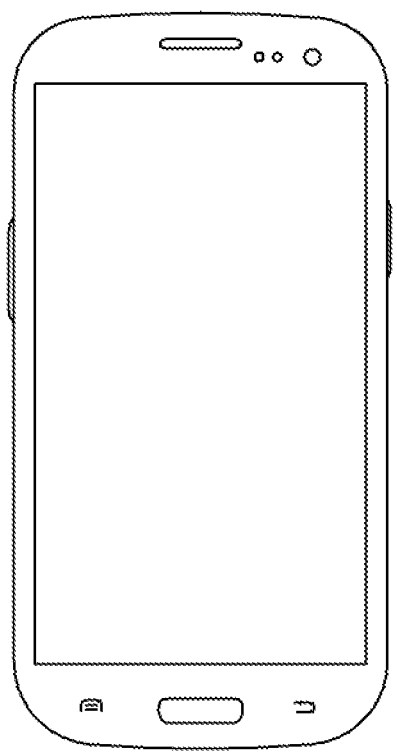

FIGS. 12 to 14 illustrate an exemplary semiconductor system to which semiconductor devices of the data storage systems 1 to 4 according to some exemplary embodiments of the present inventive concept can be employed.

FIG. 12 illustrates an example in which a semiconductor (e.g. memory) device and/or controller according to embodiments of the present inventive concept is applied to a tablet PC 1200. FIG. 13 illustrates an example in which a semiconductor device according to an embodiment of the present inventive concept is applied to a notebook computer 1300, and FIG. 14 illustrates an example in which a semiconductor device according to an embodiment of the present inventive concept is applied to a smart phone 1400. At least one of the data storage systems 1 to 4 according to some exemplary embodiments of the present inventive concept can be employed in a tablet PC, a notebook computer, a smart phone, and the like.

It is obvious to one skilled in the art that the semiconductor (e.g. memory) devices and/or controllers according to some exemplary embodiments of the present inventive concept may also be applied to other IC devices not illustrated herein. In the above-described exemplary embodiments, the tablet PC 1200, the notebook computer 1300 and the smart phone 1400 have been exemplified as the semiconductor devices according to the exemplary embodiments of the present inventive concept, but aspects of the present inventive concept are not limited thereto. In some exemplary embodiments of the present inventive concept, the semiconductor device may be implemented as a computer, an ultra mobile personal computer (UMPC), a work station, a net-book, a personal digital assistant (PDA), a portable computer, a web tablet, a wireless phone, a mobile phone, a smart phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, a digital video player, and the like.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present exemplary embodiments be considered in all respects as illustrative and not restrictive, reference being made to the appended claims rather than the foregoing description to indicate the scope of the invention.

What is claimed is:

1. A data storage system comprising:
a memory device, including a nonvolatile memory and a memory controller configured to program data to at least m pages of the nonvolatile memory, where m is a natural number; and
a RAID controller configured to generate a RAID configuration signal, including a RAID operation signal for activating and deactivating a RAID operation of the memory device, and to transmit the data and the RAID configuration signal to the memory controller,
wherein the memory controller is further configured to generate a RAID parity using first to (m−1)th data from the RAID controller and program the first to (m−1)th data to the first to (m−1)th pages and the RAID parity to the mth page when the RAID operation signal is activated, and
wherein the memory controller is further configured to program the first to mth data received from the RAID controller to the first to mth pages when the RAID operation signal is deactivated.

2. The data storage system of claim 1, wherein the data includes an error correction code (ECC).

3. The data storage system of claim 2, wherein the memory controller is configured to first perform an ECC check and then additionally perform a RAID recovery operation of the nonvolatile memory when there is an error in the ECC check result.

4. The data storage system of claim 1, wherein the RAID configuration signal further includes a RAID recovery time, a RAID operating method, a RAID configuration area in the nonvolatile memory, and a RAID partial operation signal.

5. The data storage system of claim 1, wherein the memory controller is configured to generate a health status report, including RAID operation data of the nonvolatile memory, a position and status of a defective chip, and a RAID rebuild progress status, and transmit the health status report to a signal receiver of the RAID controller.

6. The data storage system of claim 5, wherein the RAID controller is configured to activate the RAID operation signal depending on content of the health status report.

7. The data storage system of claim 1, wherein the memory controller is configured to generate and program the RAID parity to the nonvolatile memory multiple times.

8. The data storage system of claim 1, wherein the nonvolatile memory is comprised of a plurality of memory chips and the first to mth pages are arranged in different memory chips.

9. The data storage system of claim 1, wherein the memory device includes a solid state drive (SSD) and the RAID controller is positioned outside the memory device.

10. The data storage system of claim 5, wherein the memory controller is configured to adjust a structure of the data and a number of RAID parities used for the RAID operation according to status in the health status report.

11. The data storage system of claim 5, wherein the RAID controller is configured to monitor RAID recovery frequency of the nonvolatile memory.

12. A data storage device comprising:
m memory chips, where m is a natural number greater than one;
a plurality of memory controllers configured to program data to the first to mth memory chips; and
a controller configured to receive a RAID configuration signal, including a RAID operation signal for determining whether to activate or deactivate a RAID operation, and data from a host and to transmit the same to at least one of the memory controllers,
wherein the controller is further configured to control RAID operations of the plurality of memory controllers using the RAID configuration signal, each of the memory controllers being configured to generate a RAID parity using first to (m−1)th data from the controller and program the first to (m−1)th data to the first to (m−1)th memory chips and the RAID parity to the mth memory chip when the RAID operation signal is activated, and
wherein the controller is further configured to program the first to mth data received from the controller to the first to mth memories when the RAID operation signal is deactivated.

13. The data storage device of claim 12, wherein the RAID configuration signal further includes a RAID recovery time, a RAID operating method, a RAID configuration area in the memory chips, and a RAID partial operation signal.

14. The data storage device of claim 13, wherein the RAID operating method includes RAID level 0, RAID level 1, RAID level 5, RAID level 6, RAID level 10, and merged RAID level.

15. The data storage device of claim 12, wherein the memory controller is further configured to generate a health status report, including RAID operation data of the memory chips, a position and status of a defective chip, and a RAID rebuild progress status, and transmit the health status report to the host.

16. The data storage device of claim 12, wherein the memory controller is further configured to generate a RAID parity using first to (m−2)th data received from the controller and program the first to (m−2)th data and the RAID parity to the remaining memory chips when an error is detected in one of the first to mth memory chips.

17. The data storage device of claim 12, wherein the memory controller is further configured to perform a RAID rebuild operation when an error is detected in one of the first to mth memory chips.

18. A semiconductor device comprising:
a nonvolatile memory comprising m memory chips, where m is a natural number greater than one;
a memory controller configured to control access operations of the m memory chips; and
a RAID controller configured to turn ON and OFF a RAID operation of the memory controller by transmitting a RAID operation signal to the memory controller,
wherein the memory controller is further configured to write a data unit to each of m−1 of the memory chips and a parity value calculated from the data unit to an mth memory chip when the RAID operation of the memory controller is ON, and
wherein the memory controller is further configured to write the data unit to each of the m memory chips when the RAID operation of the memory controller is OFF.

19. The semiconductor device of claim 18, further comprising:
an error correcting unit configured to detect and correct one or more bit errors in the data unit read from the m memory chips.

20. The semiconductor device of claim 18, wherein the RAID controller is further configured to enable a RAID recovery in accordance with at least one of RAID level 0, RAID level 1, RAID level 5, RAID level 6, RAID level 10, and merged RAID level.

* * * * *